United States Patent
Rowell et al.

(10) Patent No.: US 10,313,032 B2
(45) Date of Patent: Jun. 4, 2019

(54) TEST SYSTEM AND METHOD FOR TESTING A DEVICE UNDER TEST

(71) Applicant: Rohde & Schwarz GmbH & Co. KG, Munich (DE)

(72) Inventors: Corbett Rowell, Munich (DE); Hendrik Bartko, Unterhaching (DE); Adam Tankielun, Ottobrunn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 5 days.

(21) Appl. No.: 15/787,231

(22) Filed: Oct. 18, 2017

(65) Prior Publication Data

US 2018/0109335 A1    Apr. 19, 2018

(30) Foreign Application Priority Data

Oct. 19, 2016 (EP) ..................... 16194564

(51) Int. Cl.

| | |
|---|---|
| *H04B 17/12* | (2015.01) |
| *H01Q 3/26* | (2006.01) |
| *H04B 5/00* | (2006.01) |
| *G01R 29/08* | (2006.01) |
| *G01R 29/10* | (2006.01) |
| *H01Q 1/08* | (2006.01) |
| *H01Q 19/06* | (2006.01) |

(52) U.S. Cl.
CPC ............. *H04B 17/12* (2015.01); *G01R 29/08* (2013.01); *G01R 29/10* (2013.01); *H01Q 1/08* (2013.01); *H01Q 3/267* (2013.01); *H01Q 3/2676* (2013.01); *H01Q 19/065* (2013.01); *H04B 5/0043* (2013.01)

(58) Field of Classification Search
CPC combination set(s) only.
See application file for complete search history.

(56) References Cited

U.S. PATENT DOCUMENTS

| | | | |
|---|---|---|---|
| 5,670,965 A | | 9/1997 | Tuovinen et al. |
| 5,815,813 A | * | 9/1998 | Faruque ................ H04W 16/00 |
| | | | 455/446 |
| 6,088,522 A | * | 7/2000 | Lee ........................ H04W 16/20 |
| | | | 703/13 |
| 6,531,989 B1 | | 3/2003 | Barker et al. |
| 7,061,447 B1 | | 6/2006 | Bozler et al. |

(Continued)

FOREIGN PATENT DOCUMENTS

| | | |
|---|---|---|
| GB | 2406718 A | 4/2005 |
| SU | 1385101 A1 | 3/1988 |
| WO | 01/73893 A1 | 10/2001 |

OTHER PUBLICATIONS

Extended European Search Report dated Apr. 24, 2017, issued in priority European Application No. 16194564.7, filed Oct. 19, 2016, 7 pages.

*Primary Examiner* — Nay A Maung
*Assistant Examiner* — Erica L Fleming-Hall
(74) *Attorney, Agent, or Firm* — Christensen O'Connor Johnson Kindness PLLC

(57) ABSTRACT

A test system for testing a device under test is described, which comprises an antenna array having a plurality of antenna elements and an adjustment unit having a Fresnel structure. The adjustment unit is placed between the antenna array and the device under test. Further, a method for testing a device under test is described.

15 Claims, 1 Drawing Sheet

(56) References Cited

U.S. PATENT DOCUMENTS

| | | | | |
|---|---|---|---|---|
| 7,119,739 | B1* | 10/2006 | Struckman | G01R 29/10 342/174 |
| 8,471,774 | B2* | 6/2013 | Oh | G01R 29/10 342/360 |
| 9,800,355 | B1* | 10/2017 | Lee | H04B 17/17 |
| 10,044,104 | B1* | 8/2018 | Bartko | H01Q 3/267 |
| 2002/0041653 | A1 | 4/2002 | Wilkins et al. | |
| 2004/0042724 | A1* | 3/2004 | Gombert | G02B 6/124 385/37 |
| 2005/0059355 | A1* | 3/2005 | Liu | H04B 17/391 455/67.14 |
| 2010/0164815 | A1* | 7/2010 | Woo | G01R 29/10 343/703 |
| 2010/0207827 | A1* | 8/2010 | Oh | G01R 29/10 343/703 |
| 2011/0134000 | A1* | 6/2011 | Kim | G01R 29/10 343/703 |
| 2012/0081265 | A1* | 4/2012 | Kennedy | H01Q 1/08 343/909 |
| 2012/0162031 | A1* | 6/2012 | Oh | G01R 29/10 343/703 |
| 2013/0093447 | A1* | 4/2013 | Nickel | H04W 24/06 324/750.16 |
| 2013/0249746 | A1* | 9/2013 | Oh | G01R 29/105 343/703 |
| 2015/0123672 | A1* | 5/2015 | Ao | G01R 29/0814 324/512 |
| 2016/0014613 | A1* | 1/2016 | Ponnampalam | H04W 16/18 370/254 |
| 2017/0222735 | A1* | 8/2017 | Kawamura | H04B 17/102 |
| 2017/0223559 | A1* | 8/2017 | Kong | H04W 24/06 |
| 2018/0262281 | A1* | 9/2018 | Qi | H04B 17/12 |

* cited by examiner

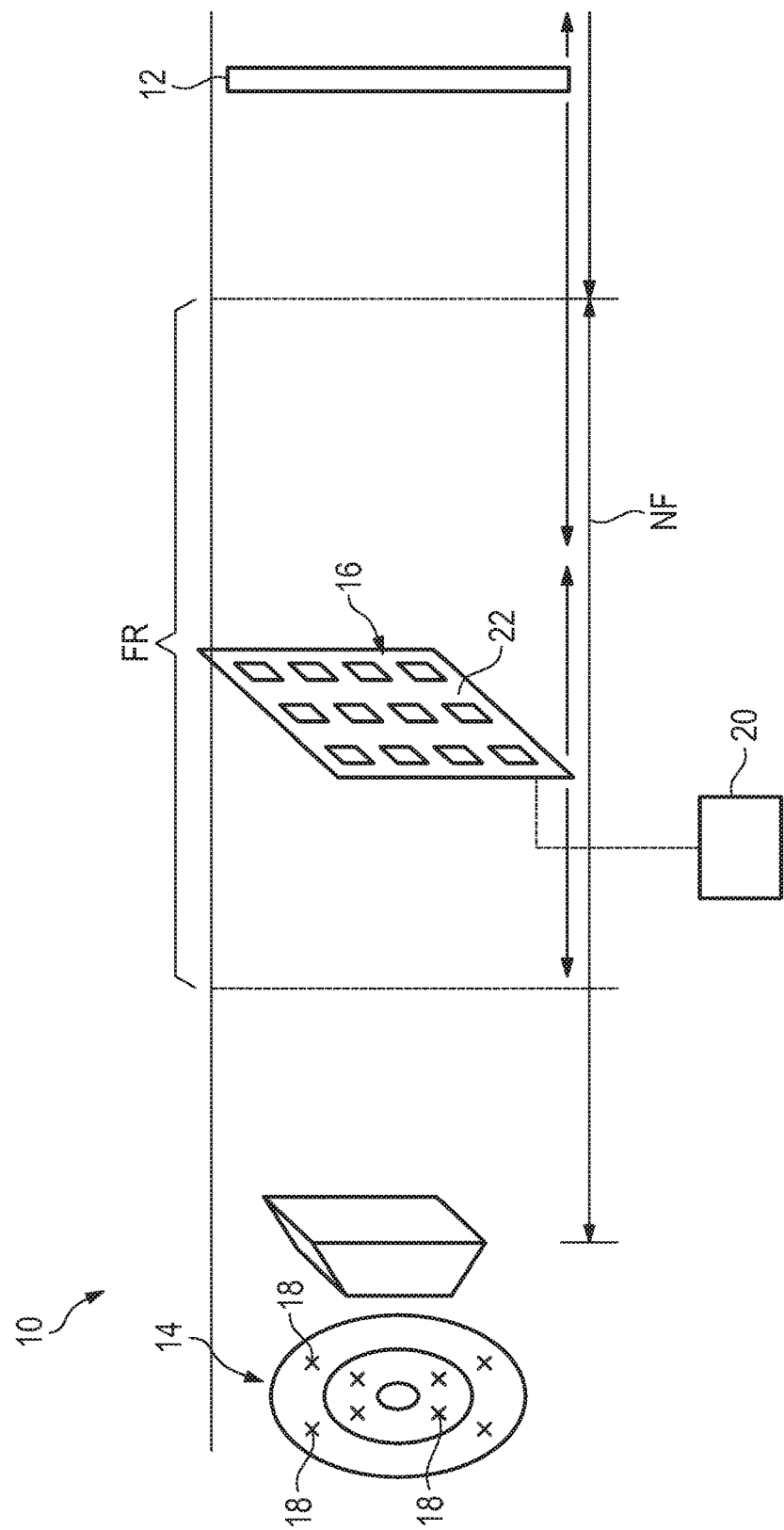

TEST SYSTEM AND METHOD FOR TESTING A DEVICE UNDER TEST

TECHNICAL FIELD

Embodiments of the present disclosure relate to a test system for testing a device under test as well as a method for testing a device under test.

BACKGROUND

In the state of the art, test systems are known which are used for testing a device under test such as a communication device, for instance a 4G or 5G communication device. The test system usually comprises an antenna array which has a plurality of individual antenna elements used to emit electromagnetic waves. The individual antenna elements are controlled such that whole antenna array is deemed to be one single antenna element emitting one electromagnetic signal having certain characteristics. Accordingly, phases and amplitudes of the electromagnetic waves emitted by the individual antenna elements are adjusted appropriately.

Generally, the test system can be used to test the device under test under far field conditions inside a small test chamber of the test system. It is known that far field conditions correspond to electromagnetic signals being plane waves. Hence, antenna arrays have to be provided which can emit plane waves at the location of the device under test. Usually, the device under test is positioned in the near field of the antenna array. Thus, the antenna array has to emit plane waves in its near field in order to ensure that far field conditions can be tested. Therefore, the antenna elements of the antenna array are controlled such that they generate electromagnetic waves which together form a plane wave at the location of the device under test, for instance. Then, it is possible to measure and analyze the receiving and transmission properties of the device under test under far field conditions even though a small distance is provided between the antenna array and the device under test.

Usually, the arrangement of the plurality of antennas within the antenna array is provided such that optimal performances are obtained for a certain test condition. Accordingly, the antenna array is suitable for a specific application, in particular a certain distance between the antenna array and the device under test which in turn corresponds to a certain frequency of the plane wave and/or a specific size of the device under test.

However, the user of such a test system also wants to test different devices which may have different sizes and/or test the same device with different frequencies. Thus, another antenna array has to be installed and calibrated in order to perform these further tests being of interest. This results in a lot of additional effort which in turn increases the costs of the measurements.

SUMMARY

Embodiments of the present disclosure provide a test system for testing a device under test, comprising an antenna array having a plurality of antenna elements and an adjustment unit having a Fresnel structure wherein the adjustment unit is placed between the antenna array and the device under test.

Further, embodiments of the present disclosure provide a method for testing a device under test, with the following steps:

providing an antenna array having a plurality of antenna elements;
providing a device under test;
providing an adjustment unit having a Fresnel structure; and
placing the adjustment unit between the antenna array and the device under test.

Accordingly, an adjustment unit having a Fresnel structure and an antenna array can be combined in order to adjust the plane waves generated such that different sizes of devices under test can be tested in a cost-efficient manner. Accordingly, it is not necessary to use another antenna array for testing a differently sized device under test or for testing at a different frequency. Changing the antenna array would cause additional calibration work which in turn increases the costs for the testing. The adjustment unit enables the possibility to tune the electromagnetic wave generated by the antenna array such that the combination of antenna array and adjustment unit are configured to emit different electromagnetic signals in order to test different devices under tests and/or testing at different frequencies without recalibrating the test system because of using a different antenna array. Generally, the frequency range of the test system can be adapted without switching the antenna array as only the adjustment unit is adapted accordingly.

According to an aspect, the adjustment unit is separately formed with respect to the antenna array. Thus, the adjustment unit is not located within the antenna array as the adjustment unit is a mechanically separately formed unit. A certain distance is provided between the antenna array and the adjustment unit.

Alternatively, the adjustment unit may be positioned directly adjacent to the antenna array.

According to another aspect, the adjustment unit is placed in the near field of the antenna array, and in the Fresnel region in some embodiments. The near field of the test system, for example the emitting antenna array or the emitting device under test, is limited by the Fraunhofer distance defined by the formula $$d_F = \frac{2D^2}{\lambda},$$

wherein D is the aperture of the device under test or the aperture of the antenna array and $\lambda$ is the wavelength of the electromagnetic signal wherein the wavelength corresponds to the desired frequency. Thus, the adjustment unit is located within the Fraunhofer distance. The Fresnel region is a part of the near field which extends until the Fraunhofer distance. However, the Fresnel region begins at a certain distance from the antenna array emitting electromagnetic waves.

Moreover, the antenna array may be a plane wave converter. Accordingly, the antenna array emits plane waves at a certain distance wherein these plane waves are used to test the device under test under far field conditions.

In some embodiments, the test system is configured to generate plane waves in the near field of the antenna array. Thus, the antenna array is configured to emit plane waves within the Fraunhofer distance mentioned above.

Furthermore, the adjustment unit may be configured to project different field distributions. For instance, plane wave measurements, multipath measurements or multiple-in multiple-out (MIMO) measurements can be performed by the test system since the adjustment unit is configured to project different radiation patterns used for the different measurements.

According to another aspect, a control unit is provided which is connected with the adjustment unit for controlling the adjustment unit. The adjustment unit is controlled in order to enable different field distributions projected by the adjustment unit. For instance, the position of the adjustment unit with respect to the antenna array and/or the device under test can be controlled.

The adjustment unit may comprise a plate having at least a semi-periodic arrangement of slots or patches. The semi-periodic arrangement ensures that the Fresnel structure is achieved.

In some embodiments, the plate has a periodic arrangement of slots or patches. For instance, the Fresnel structure may be established by concentric rings defining a periodic arrangement.

Further, the plate may be made of metal. Thus, the transparency of the adjustment unit is lowered in the regions made by metal. For instance, the patches are made by metal.

According to a certain embodiment, the position of the adjustment unit is determined by the Fourier Optics equations. This ensures that the adjustment unit adjusts the electromagnetic waves emitted in the desired way such that the receiving unit receives plane waves for testing the far field conditions, for instance. Therefore, the exact positioning of the adjustment unit may be controlled by the controller in order to ensure that the desired position is achieved resulting in a desired field distribution of the electromagnetic waves having passed the adjustment unit.

The adjustment unit may be an optical unit. The electromagnetic waves emitted by the device under test and/or the antenna array are amended accordingly while passing the adjustment unit.

According to another aspect, the adjustment unit is configured to be at least partly a lens. Thus, the adjustment unit having the Fresnel structure is partly formed as a Fresnel lens being compact while having a large aperture and short focal length. Furthermore, this ensures that plane waves can be generated at the desired location.

Furthermore, the adjustment unit may be configured to be at least partly a reflector. For instance, the adjustment unit comprises a Fresnel reflector portion, particularly a compact linear Fresnel reflector portion. In general, the electromagnetic signals emitted can be focused by the Fresnel reflector portion.

Generally, the adjustment unit may be a lens or a reflector.

Alternatively, the adjustment unit may be controllable such that its properties can be controlled appropriately.

The receiving and/or transmission properties of the device under test can be measured under far field conditions at different frequencies, in particular in the respective near field of the device under test and/or the antenna array.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

The FIGURE shows a test system according to an embodiment of the present disclosure.

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the FIGURE, a test system 10 is shown for testing a device under test 12 (DUT) such as a communication device. The test system 10 comprises an antenna array 14 for generating and/or receiving a plane wave wherein the device under test 12 is positioned in a certain distance with respect to the antenna array 14. The test system 10 also comprises an adjustment unit 16 which has a Fresnel structure. The adjustment unit 16 is separately formed with respect to the antenna array 14. Moreover, the adjustment unit 16 is positioned between the antenna array 14 and the device under test 12 such that the sides of the antenna array 14 and the device under test 12 used for emitting and/or receiving electromagnetic waves face the adjustment unit 16.

Generally, the antenna array 14 comprises a plurality of individual antenna elements 18. Since the antenna array 14 is a plane wave converter, the individual antenna elements 18 are controlled such that the electromagnetic waves form a radiation pattern which is deemed to be one electromagnetic wave emitted by the whole antenna array 14.

Further, the antenna array 14 is configured to generate plane waves in its near field NF. This means that the electromagnetic wave emitted by the whole antenna array 14 has the shape of a plane wave at a certain distance being within the near field of the antenna array 14.

As the adjustment unit 16 is arranged between the antenna array 14 and the device under test 12, the emitted electromagnetic waves impinge the adjustment unit 16 such that the radiation pattern emitted by the antenna array 14 is adjusted. Thus, it is possible to adjust the radiation pattern such that different testing frequencies and/or different sized devices under test 12 can be tested without amending the whole test system 10. In the shown embodiment, the adjustment unit 16 is located, for example, within the Fresnel region FR of the antenna array 14.

For adapting the radiation pattern for testing purposes, the adjustment unit 16 is controlled by a control unit 20 which is connected with the adjustment unit 16. The control unit 20 may control the position of the adjustment unit 16 with respect to the antenna array 14 and the device under test 12 in order to adjust the testing conditions as will be described later.

The adjustment unit 16 may comprise a metal plate 22 having at least a semi-periodic arrangement of slots and/or patches defining the Fresnel structure. Moreover, the slots and/or patches are arranged in a periodic arrangement. In addition, the adjustment unit 16 comprises lens portions and/or reflector portions such that the adjustment unit 16 is at least partly a lens, and a Fresnel lens in some embodiments, and a reflector respectively, and a Fresnel reflector in some of these embodiments. Alternatively, the adjustment unit 16 is a lens or a reflector depending of the tests to be intended by the test system 10.

In general, the adjustment unit 16 can be used to adjust the radiation pattern or the field distribution of the electromagnetic waves after passing the adjustment unit 16. Hence, it is possible to perform plane wave, multiple-in multiple-out (MIMO) and/or multipath measurements by using the test system 10, in particular the combination of the antenna array 14 and the adjustment unit 16.

For instance, the adjustment unit 16 is controlled by the control unit 20, particularly the different portions. Alternatively or supplementary, the control unit 20 controls the position of the adjustment unit 16 with respect to the device under test 12 and the antenna array 14 in order to adjust the testing conditions, for example the testing frequency or rather the distance at which plane waves are generated.

In some embodiments, the exact position of the adjustment unit 16 is determined by the Fourier Optics equations defined by the classical optics using Fourier transforms.

Generally, the performance of the test system 10 is enhanced, in particular the one of the antenna array 14 acting as the plane wave converter. The performance is mainly improved regarding mm-waves emitted and/or received by the antenna array 14.

The whole test system 10 can be used for over the air measurements of devices under test 12, for instance 5G devices under test.

As already mentioned, the adjustment unit 16 is configured to adjust the field distribution of the electromagnetic waves. Thus, measurements, in for example MIMO measurements, using beam forming can be performed by using the test system 10.

Alternatively to the above described procedure wherein the receiving properties of the device under test 12 are measured, the test system 10 can also be used to measure the transmitting properties of the device under test 12.

Accordingly, the electromagnetic waves emitted by the device under test 12 are adjusted by the adjustment unit 16 placed between the device under test 12 and the antenna array 14 before they impinge on the antenna array 14.

Therefore, the radiation characteristics of a device under test 12 can be measured under far field conditions even though the antenna array 14 is located at a distance with respect to the device under test 12 being lower than the Fraunhofer distance which is defined by the formula $$d_F = \frac{2D^2}{\lambda}.$$

In the formula, D is the aperture of the device under test (radiator) and $\lambda$ is the wavelength of the electromagnetic signal wherein the wavelength corresponds to the desired frequency.

Generally, the test system 10, and in some embodiments the adjustment unit 16, is configured to tune the plane wave projection such that plane waves can be created closer to the receiving device (device under test 12 or antenna array 14).

Furthermore, the frequency range of the antenna array 14 can be extended due to the Fresnel structure of the adjustment unit 16 without controlling the antenna array 14 or exchanging the antenna array 14.

Thus, the test system 10 can be used to measure the receiving and/or transmission properties of the device under test 12 under far field conditions at different frequencies as the frequency of the plane wave emitted by the antenna array 14 may be varied due to the adjustment unit 16. Accordingly, the frequency and/or plane wave zone distance is adjusted among different measurements without the need of interchanging the antenna array 14. Hence, no further calibration steps are required since only one antenna array 14 is used for all these measurements.

In general, the method for measuring the device under test 12 is performed by using the test system 10 as described above. Accordingly, the test system 10 is used to measure the device under test 12 under far field conditions even though the distance between the antenna array 14 and the device under test 12 may be smaller than the Fraunhofer distance or different to the used frequency.

Hence, the adjustment unit 16 ensures that different frequencies can be tested without adapting the distance between the antenna array 14 and the device under test 12.

In addition, the test system 10 may comprise a chamber, in particular an anechoic chamber, wherein the antenna array 14 and the device under test 12 are positioned within this chamber.

Since the antenna array 14 is a plane wave converter, the test system 10 comprising the antenna array 14 and the adjustment unit 16 can be deemed as a Fresnel plane wave generator.

In general, the test system 10 is configured such that transmission and/or receiving properties of the device under test 12 can be measured in the plane wave zone of the antenna array 14.

The control unit 20 may include, in some embodiments, logic for implementing the technologies and methodologies described herein. This logic of the control unit 20 can be carried out in either hardware or software, or a combination of hardware and software. In some embodiments, the control unit 20 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control unit 20 includes a microprocessor and a memory storing logic modules and/or instructions. In an embodiment, the control unit 20 includes one or more ASICs having a plurality of predefined logic components. In an embodiment, the control unit 20 includes one or more FPGA having a plurality of programmable logic components. In an embodiment, the control unit 20 includes hardware circuit implementations (e.g., implementations in analog circuitry, implementations in digital circuitry, and the like, and combinations thereof). In an embodiment, the control unit 20 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A test system for testing a device under test, comprising:
an antenna array having a plurality of antenna elements;

an adjustment unit having a Fresnel structure, said adjustment unit being placed between said antenna array and said device under test, said antenna array being a plane wave converter, said adjustment unit being placed in a near field of said antenna array; and a control unit connected with said adjustment unit for controlling said adjustment unit, the control unit controlling the position of the adjustment unit with respect to at least one of the antenna array and the device under test such that different field distributions are projected by the adjustment unit.

2. The test system according to claim 1, wherein said adjustment unit is separately formed with respect to said antenna array.

3. The test system according to claim 1, wherein said test system is configured to generate plane waves in the near field of said antenna array.

4. The test system according to claim 1, wherein said adjustment unit is configured to project different field distributions.

5. The test system according to claim 1, wherein said adjustment unit comprises a plate having at least a semi-periodic arrangement of slots or patches.

6. The test system according to claim 5, wherein said plate has a periodic arrangement of slots or patches.

7. The test system according to claim 5, wherein said plate is made of metal.

8. The test system according to claim 1, wherein a position of said adjustment unit is determined with Fourier transforms.

9. The test system according to claim 1, wherein said adjustment unit is an optical unit.

10. The test system according to claim 1, wherein said adjustment unit is configured to be at least partly a lens.

11. The test system according to claim 1, wherein said adjustment unit is configured to be at least partly a reflector.

12. A method for testing a device under test, with the following steps:

providing an antenna array having a plurality of antenna elements, the antenna array being a plane wave converter;

providing a device under test;

providing an adjustment unit having a Fresnel structure;

placing said adjustment unit between said antenna array and said device under test; and measuring at least one of the receiving and transmission properties of the device under test under far field conditions at different frequencies.

13. A test system for testing a device under test, comprising:

an antenna array having a plurality of antenna elements, said antenna array being a plane wave converter; and an adjustment unit having a Fresnel structure, said adjustment unit being placed between said antenna array and said device under test, said adjustment unit being placed in the near field of said antenna array, wherein the test system is configured to measure at least one of the receiving and the transmission properties of the device under test under far field conditions at different frequencies.

14. The system according to claim 13, wherein the test system is configured to measure at least one of the receiving and the transmission properties of the device under test under far field conditions at different frequencies in the respective near field of at least one of the device under test and the antenna array.

15. The system according to claim 1, wherein the test system comprises a chamber, said antenna array and said device under test being positioned within said chamber.

* * * * *